US011022642B2

(12) United States Patent
David et al.

(10) Patent No.: US 11,022,642 B2
(45) Date of Patent: Jun. 1, 2021

(54) SEMICONDUCTOR YIELD PREDICTION

(71) Applicant: PDF Solutions, Inc., Santa Clara, CA (US)

(72) Inventors: Jeffrey Drue David, San Jose, CA (US); Tomonori Honda, Santa Clara, CA (US); Lin Lee Cheong, San Jose, CA (US)

(73) Assignee: PDF Solutions, Inc., Santa Clara, CA (US)

( * ) Notice: Subject to any disclaimer, the term of this patent is extended or adjusted under 35 U.S.C. 154(b) by 0 days.

(21) Appl. No.: 16/112,278

(22) Filed: Aug. 24, 2018

(65) Prior Publication Data
US 2019/0064253 A1    Feb. 28, 2019

Related U.S. Application Data

(60) Provisional application No. 62/550,169, filed on Aug. 25, 2017.

(51) Int. Cl.
*G01R 31/28* (2006.01)
*G01R 31/26* (2020.01)
*H01L 21/66* (2006.01)
*G06N 3/08* (2006.01)

(52) U.S. Cl.
CPC ....... *G01R 31/287* (2013.01); *G01R 31/2642* (2013.01); *G01R 31/2894* (2013.01);
(Continued)

(58) Field of Classification Search
CPC .............. G01R 31/287; G01R 31/2894; G01R 31/2642; G01R 31/2831; G06N 3/08;
(Continued)

(56) References Cited

U.S. PATENT DOCUMENTS 3,751,647 A   8/1973  Maeder et al.
5,793,650 A   8/1998  Mirza
(Continued)

FOREIGN PATENT DOCUMENTS

CN   101738991 B   9/2014

OTHER PUBLICATIONS

International Search Report and Written Opinion for PCT Application No. PCT/US2015//062693; dated Feb. 9, 2016.
(Continued)

*Primary Examiner* — Edward Chin
(74) *Attorney, Agent, or Firm* — Dergosits & Noah LLP

(57) ABSTRACT

A method for predicting yield for a semiconductor process. A particular type of wafer is fabricated to have a first set of features disposed on the wafer, with a wafer map identifying a location for each of the first set of features on the wafer. Data from wafer acceptance tests and circuit probe tests is collected over time for wafers of that particular type as made in a semiconductor fabrication process, and at least one training dataset and a least one validation dataset are created from the collected data. A second set of "engineered" features are created and also incorporated onto the wafer and wafer map. Important features from the first and second sets of features are identified and selected, and using those important features as inputs, a number of different process models are run, with yield as the target. The results of the different models can be combined, for example, statistically.

18 Claims, 5 Drawing Sheets

(52) U.S. Cl.
CPC .............. *G06N 3/08* (2013.01); *H01L 22/20* (2013.01); *G01R 31/2831* (2013.01); *H01L 22/12* (2013.01); *H01L 22/14* (2013.01)

(58) Field of Classification Search
CPC ......... G06N 20/00; H01L 22/20; H01L 22/12; H01L 22/14; G06K 9/6231; G06K 9/6282; G06K 9/6256
See application file for complete search history.

(56) References Cited

U.S. PATENT DOCUMENTS

| | | | |
|---|---|---|---|
| 5,923,553 | A | 7/1999 | Yi |
| 6,610,550 | B1 | 8/2003 | Pasadyn et al. |
| 6,751,519 | B1 | 6/2004 | Satya |
| 6,819,426 | B2 | 11/2004 | Sezginer et al. |
| 6,968,253 | B2 | 11/2005 | Mack et al. |
| 7,117,057 | B1 | 10/2006 | Kuo et al. |
| 7,184,853 | B2 | 2/2007 | Roberts et al. |
| 7,289,214 | B1 | 10/2007 | Li et al. |
| 7,403,832 | B2 | 7/2008 | Schulze et al. |
| 7,842,442 | B2 | 11/2010 | Seltmann et al. |
| 7,873,585 | B2 | 1/2011 | Izikson |
| 7,957,826 | B2 | 6/2011 | Ausschinitt et al. |
| 8,233,494 | B2 | 7/2012 | Amini et al. |
| 8,339,595 | B2 | 12/2012 | Den Boef |
| 9,002,498 | B2 | 4/2015 | Chang |
| 9,087,176 | B1 | 7/2015 | Chang et al. |
| 9,116,442 | B2 | 8/2015 | Adel et al. |
| 2003/0014145 | A1 | 1/2003 | Reiss et al. |
| 2003/0074639 | A1 | 4/2003 | Park et al. |
| 2003/0229410 | A1 | 12/2003 | Smith et al. |
| 2004/0167655 | A1 | 8/2004 | Middlebrooks et al. |
| 2004/0181728 | A1 | 9/2004 | Pellegrini |
| 2004/0233439 | A1 | 11/2004 | Mieher |
| 2008/0057418 | A1 | 3/2008 | Seltmann |
| 2008/0262769 | A1 | 10/2008 | Kadosh et al. |
| 2008/0275586 | A1 | 11/2008 | Ko et al. |
| 2010/0321654 | A1 | 12/2010 | Den Boef |
| 2013/0054186 | A1 | 2/2013 | Den Boef |
| 2013/0060354 | A1 | 3/2013 | Choi et al. |
| 2013/0110276 | A1 | 5/2013 | Cheng et al. |
| 2013/0208279 | A1 | 8/2013 | Smith |
| 2013/0230797 | A1 | 9/2013 | Van Der Sanden |
| 2013/0282340 | A1 | 10/2013 | Liu et al. |
| 2013/0310966 | A1 | 11/2013 | MacNaughton et al. |
| 2014/0094015 | A1 | 4/2014 | Kasa |
| 2014/0362363 | A1 | 12/2014 | Cai |
| 2015/0253373 | A1 | 9/2015 | Callegari et al. |
| 2015/0369857 | A1 | 12/2015 | Nakamura |
| 2018/0330493 | A1* | 11/2018 | Milligan .............. G06N 3/0409 |

OTHER PUBLICATIONS

Pilsung Kang et al., 'Virtual Metrology for Run-to-Run Control in Semiconductor Manufacturing', 2011, vol. 38, pp. 2508-2522, Elsevier, Expert Systems with Application.

William H. Arnold, Towards 3nm Overlay and Critical Dimension Uniformity: An Integrated Error Budget for Double Patterning Lithography', 2008, SPIE vol. 6924, Optical Microlithography XXI, pp. 1-9.

Prasad Dasari, Jie Li, Jiangtao Hu, Nigel Smith and Oleg Kritsun (2011). Diffraction Based Overlay Metrology for Double Patterning Technologies, Recent Advances in Nanofabrication Techniques and Applications, Prof. Bo Cui (Ed.), ISBN: 978-953-307-602-7, InTech, Available from: http://www.intechopen.com/books/recentadvances-n-nanofabrication-techniques-and-applications/diffraction-based-overlay-metrology-for-doublepatterning-technologies.

Peter M. O'Neili et al., 'Statistical Test: A New Paradigm to Improve Test Effectiveness & Efficiency', 2007, pp. 1-10, IEEE International Test Conference. ISBN: 1-4244-1128-9/07.

Ajay Khochel et al., 'A Tutorial on STDF Fail Datalog Standard', 2008, pp. 1-10, IEEE International Test Conference, ISBN: 1-4244-4203-0/08.

Raphael Robertazzi et al., 'New Tools and Methodology for Advanced Parametric and Defect Structure Test', 2010, pp. 1-10, IEEE International Test Conference, ISBN: 978-1-4244-7207-9/10.

Shane A. Lynn, 'Real-Time Virtual Metrology and Control of Etch Rate in an Industrial Plasma Chamber', pp. 1-6; Part of 2012 IEEE Multi-Conference on Systems and Control; Oct. 3-5, 2012. Dubrovnik, Croatia 2012 IEEE International Conference on Control Applications (CCA).

Prasad Dasari, Jie Li, Jiangtao Hu, Nigel Smith and Oleg Kritsun (2011). Diffraction Based Overlay Metrology for Double Patterning Technologies, Recent Advances in Nanofabrication Techniques and Applications, Prof. Bo Cui (Ed.), ISBN: 978-953-307-602-7, InTech, Available from: http://www.intechopen.com/books/recentadvances-in-nanofabrication-techniques-and-applications/diffraction-based-overlay-metrology-for-doublepatterning-technologies.

Rao Desineni et al., 'The Grand Pareto: A Methodology for Identifying and Quantifying Yield Detractors in Volume Semiconductor Manufacturing', May 2, 2007, pp. 87-100, vol. 20, IEEE Transactions on Semiconductor Manufacturing.

Pieter Kneilssen et al., Powerpoint Presentation titled 'Litho InSight, a novel approach towards on-product litho performance improvement'; 31 pages, APC Conference XXVI in Ann Arbor, Michigan.

John C. Robinson, Ph.D., 'Intelligent Feed-forward of Non-Litho Errors for 3D Patterning', 20 pages, Sep. 30, 2014, APC Conference XXVI in Ann Arbor, Michigan.

Michael Hackerott, 'Semiconductor Manufacturing and Engineering Data Analysis', 38 pages.

Prasad Dasari et al, 'A Comparison of Advanced Overlay Technologies', 9 pages, 2010, vol. 7638, Metrology, Inspection, and Process Control for Microlithography XXIV, ccc Code: 0277-786X/10, doi: 10.1117/12.848189.

Daewoong An et al., 'A Semiconductor Yields Prediction Using Stepwise Support Vector Machine', Nov. 17-20, 2009, Proceedings of 2009 IEEE International Symposium on Assembly and Manufacturing in Suwon Korea, 7 pages.

Sae-Rom Pak et al., 'Yield Prediction using Support Vectors Based Under-Sampling in Semiconductor Process', pp. 896-900, Dec. 20, 2012, International Scholarly and Scientific Research & Innovation vol. 6, World Academy of Science, Engineering and Technology.

* cited by examiner

SEMICONDUCTOR YIELD PREDICTION

CROSS REFERENCE

This application claims priority from U.S. Provisional Patent Application No. 62/550,169 entitled System and Methods for Yield Prediction, Test Optimization, and Variable Importance Identification Semiconductor and Electronics Manufacturing, filed Aug. 25, 2017, incorporated herein by reference in its entirety.

TECHNICAL FIELD

This disclosure relates generally to semiconductor manufacturing processes, and more particularly, to methods for predicting yield, optimizing tests and managing inventories in such processes, as well as identifying the importance of particular features or variables for predicting yield and optimizing tests.

BACKGROUND

The semiconductor manufacturing industry is known as a complex and demanding business, and it continues to evolve with major changes in device architectures and process technologies. Typically, the semiconductor industry has been characterized by sophisticated high-tech equipment, a high degree of factory automation, and ultra-clean manufacturing facilities that cost billions of dollars in capital investment and maintenance expense.

Predicting yield is an important part of the process for fabricating microchips particularly as the fabrication processes become increasingly expensive. Yield prediction can be made at different steps in the manufacturing process. FIG. 1 gives a high-level view of the basic steps that can be taken in making a semiconductor device, while there may actually be hundreds of more detailed steps. In general, input data can be collected from the process at every step and sub-step of a production run, and yield and other performance characteristics may be calculated and/or predicted from the input data for each step as well as for the entire process.

Wafer fabrication occurs in step 102, where a large number of integrated circuits are formed on a single slice of semiconductor substrate, such as silicon, known as a wafer. Many steps are required in various sequences to build different integrated circuits. For example, deposition is the process of growing an insulating layer on the wafer. Diffusion is the process of baking impurities into areas of the wafer to alter the electrical characteristics. Ion implantation is another process for infusing the silicon with dopants to alter the electrical characteristics. In between these steps, lithographic processing allows areas of wafer to be patterned with an image, then a mask is used to expose photoresist that has been applied across the wafer, and the exposed photoresist is developed. The pattern is then etched to remove selected portions of the developed photoresist, and these steps are repeated to create multiple layers. Finally, metallization is a specialized deposition process that forms electrical interconnections between various devices/circuits formed on the wafer. The fabrication process can take several months to complete before moving on to the post-fabrication steps.

Wafer acceptance testing, also known as wafer test and sort, occurs in step 104. After a wafer has been fabricated, all the individual integrated circuits that have been formed on the wafer are tested for functional defects, for example, by applying test patterns using a wafer probe. Circuits may either pass or fail the testing procedure, and failed circuits will be marked or otherwise identified, e.g., stored in a file that represents the location of the failed circuits on a wafer map.

Assembly and packaging takes place in step 106. The wafer is diced up into separate individual circuits or dies, and each die that passed at the wafer sort/test step is bonded to and electrically connected to a frame to form a package. Each die/package is then encapsulated to protect the circuit.

In step 108, the packages are subjected to random electrical testing to ensure that circuits in the package are still working as expected. In step 110, the remaining packages go through a burn-in cycle by exposing the package to extreme but possible operating conditions so that defective components may be revealed. Burn-in may involve electrical testing, thermal exposure, stress screening, or a combination of these, over a period of time. Finally, in step 112, a final round of electrical testing is conducted on the remaining packages.

If yield can be accurately predicted at any step of the fabrication process, then it becomes possible to optimize and save costs in later steps for this wafer. For example, if a device can be predicted to be bad before wafer sort and test, then further testing and processing of that device can be avoided thus saving costs. The fabrication process of wafers can take two to three months before moving on to the post-fabrication stages, which consist of wafer test/sort, assembly/packaging, final testing, and burn-in. At each of these steps, yield can be calculated. The yield at fabrication is measured as the ratio of good wafers that make it through the wafer fabrication process to all wafers that entered to process. The yield at wafer test/sort is calculated as the ratio of non-defective chips determined at wafer test/sort to all chips that entered into wafer test/sort. The assembly/packaging yields are calculated in a similar manner, i.e., the ratio of good chips exiting the process to the number of chips that entered the process. Thus, the yield prediction can be helpful for managing inventories by informing the decision process regarding how many wafers to order in future runs.

Existing methods for predicting yield have typically been based on a univariate analysis. For example, a Markov chain can be used to predict whether a chip yield will be acceptable given the number of defects found through testing. However, as the quantity of available test data (e.g., probe data) continues to grow, multivariate analysis has become necessary. A common technique used for multivariate analysis is discriminant analysis, but this technique assumes that the data is normally distributed and independent, which is not always the case.

Recently, thanks to the ability to perform parallel processing on a massive scale, there has been lots of progress made in Machine Learning algorithms, data mining, and predictive analytics. Machine Learning is a branch of artificial intelligence that involves the construction and study of systems that can learn from data. Generally, a Machine Learning model can be constructed for a specific process parameter by sampling relevant data in order to build one or more training sets of data to represent expected performance of the process with regard to that parameter. These types of algorithms, along with parallel processing capabilities, allow for much larger datasets to be effectively processed. Such techniques are much better suited for multivariate analysis. Furthermore, confidence and propensity metrics associated with many machine learning algorithms make it possible to optimize wafer sort/testing, final tests, and burn-in activities.

Furthermore, it is important to identify the important features or variables that may be used for yield prediction. For example, if one or more particular electrical test outputs are determined to be important in the yield prediction, then this information can be used to help determine how yield can be improved through improvement of those electrical test results as well as improvement of the underlying wafer fabrication processes.

DETAILED DESCRIPTION

1. Machine Learning

Figure 1:
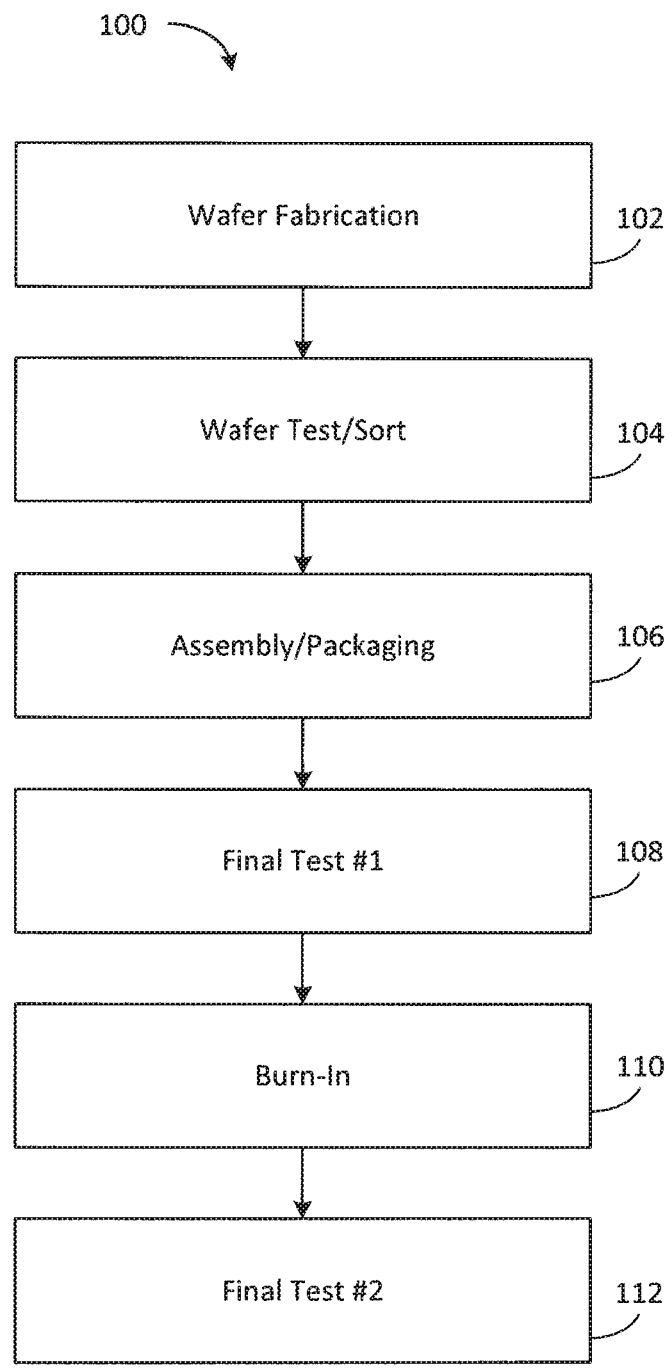
FIG. 1 is a flow chart illustrating a high-level process for making a semiconductor device.

As noted above, machine learning, data mining, and predictive analytics can be implemented using parallel processing capabilities thereby allowing much larger datasets to be processed, without the need to physically model the data. This opens up the possibility of incorporating data analysis to make adjustments to the process equipment in order to improve yield and optimize processes including inventory management and control.

Thus, if yield excursions can be predicted for a given wafer population, then those wafers could be routed for more rigorous testing. Conversely, if yield is predicted to be good, then that wafer population could undergo a much lighter testing protocol. Further, identifying the parametrics that important to the yield determination could lead to more focused and deliberate tests down the line.

Because manufacturing of semiconductor chips takes months, inventory management play a significant role in the fabless semiconductor business. When chip supply is lower than demand, revenue can be impacted. When there are too many chips in inventory, cost of storage increases. Thus, by having a better method for yield prediction, fabless companies can do a better job of managing the inventory.

Data has always played an important role in semiconductor and electronics manufacturing. Initially, data was collected manually to track work-in-progress ("WIP"). The types of data collected included metrology data (measurements taken throughout the IC fabrication process), parametric test data, die test data, final test data, defect data, process data, and equipment data. Standard statistical and process control techniques were used to analyze the datasets in order to improve yields and manufacturing efficiencies. In many instances, the analysis was performed in a manual "ad-hoc" fashion by domain experts.

However, as device nodes became smaller and tolerances became tighter, factories became more automated and the ability to collect data improved. Even with this improvement in the ability to collect data, it has been estimated that no more than half of the data is ever processed. Further, of the data that is processed and stored, more than 90% of it is never again accessed.

Thus, predictive analytics and machine learning algorithms can and should be used to address the challenges facing the semiconductor industry. By drilling deeper into the details and data of semiconductor manufacturing and knowing how to apply predictive analytics to detect and resolve process issues faster, and to tighten and target the specifications of individual manufacturing steps, increased process efficiencies can result.

Some of the foregoing techniques are further described in U.S. Publication No. 2016/0148850 entitled Process Control Techniques for Semiconductor Manufacturing Processes and in U.S. Publication No. 2017/0109646 entitled Process Control Techniques for Semiconductor Manufacturing Processes, both of which are incorporated herein in their entirety.

2. Datasets for Predictions

As mentioned above, it is highly desirable to predict output states for various aspects of the semiconductor fabrication process. For example, yield prediction can be performed on the wafer level, the lot level, or during certain time intervals (e.g., weekly, monthly, daily, etc.). Bin predictions can also be performed on a time interval basis. In order to develop effective predictions as described herein, the datasets described below are used to provide relevant inputs to one or more machine learning algorithms. For example, the machine learning algorithms may include but are not limited to: (i) a robust linear regression algorithm, such as Random Sample Consensus (RANSAC), Huber Regression, or Theil-Sen Estimator; (ii) a tree-based algorithm, such as Classification and Regression Tree (CART), Random Forest, Extra Tree, Gradient Boost Machine, or Alternating Model Tree; (iii) a neural net based algorithm, such as Artificial Neural Network (ANN); (iv) a Support Vector Machine (SVM); and others.

(1) A Wafer Acceptance Test (WAT) collects parametric test data regarding the quality of the wafers at different stages of wafer fabrication, also known as Process Control Monitoring (PCM). The WAT data is taken from test structures placed on at least a few test sites per wafer (e.g., 9, 13, etc.) or on all test sites. In one embodiment, the WAT data measurements for yield prediction input are taken at the final process stage, but these measurements could be taken either alternatively or in addition to measurements from the M3 layer, the M5 layer, etc.

(2) Circuit Probe (CP) data results from testing for functional defects on individual integrated circuits formed on the wafers, for example, by applying test patterns to the circuits. The result of a CP test is a useful target for yield prediction. Each chip in a wafer is CP tested and then categorized into a bin that represents the quality of the chip. For example, a typical binning process identifies the chips as falling into one of several different categories, such as defective, slightly defective, good, and perfect. In one embodiment, chips with defects are called "Floor Sweep" and are classified by the type and location of defects into different bins within the Floor Sweep. The result of these Floor Sweep bins are the main target for the bin fraction predictions, discussed below. The Floor Sweep chips may be useful for lower performance applications such as the Internet of Things (IOT).

3) A Wafer Map defines the 2-dimensional (x, y) coordinates for the various wafer test sites.

3. Yield Prediction and Test Optimization

Figure 2A:
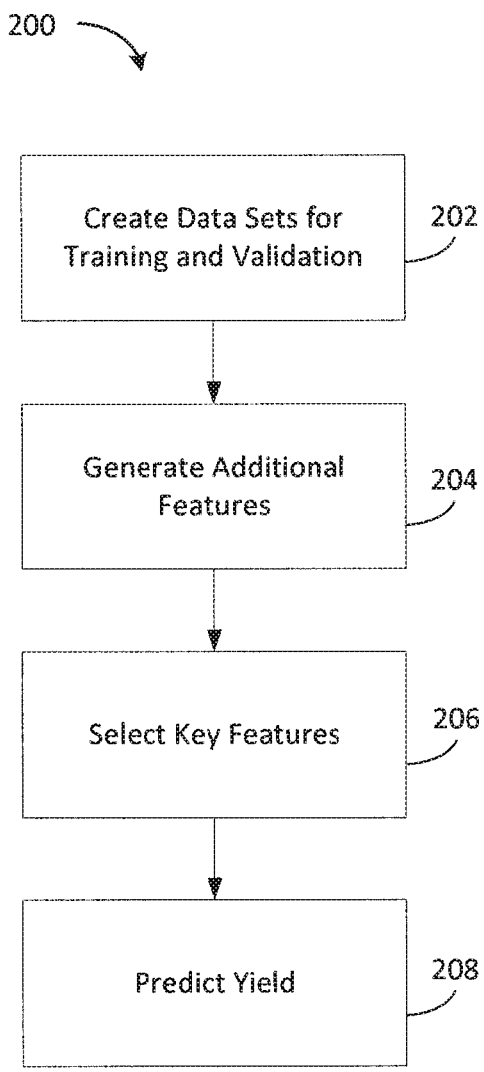
FIG. 2A is a flow chart illustrating a method for making yield predictions.

FIG. 2A illustrates a basic method 200 for predicting yield. In step 202, data sets are created from the WAT data, the CP data, and the wafer map based on typical features. In step 204, additional features are generated and incorporated onto the wafer map. In step 206, key features are identified and selected. Finally, in step 208, yield is predicted using a combination of algorithms each having a different objective. For example, one algorithm is selected to reduce variance while another algorithm is selected to reduce bias. A numerical or statistical combination of the results of the algorithms leads to a yield prediction. Each of these steps is described in more detail below.

Figure 2B:
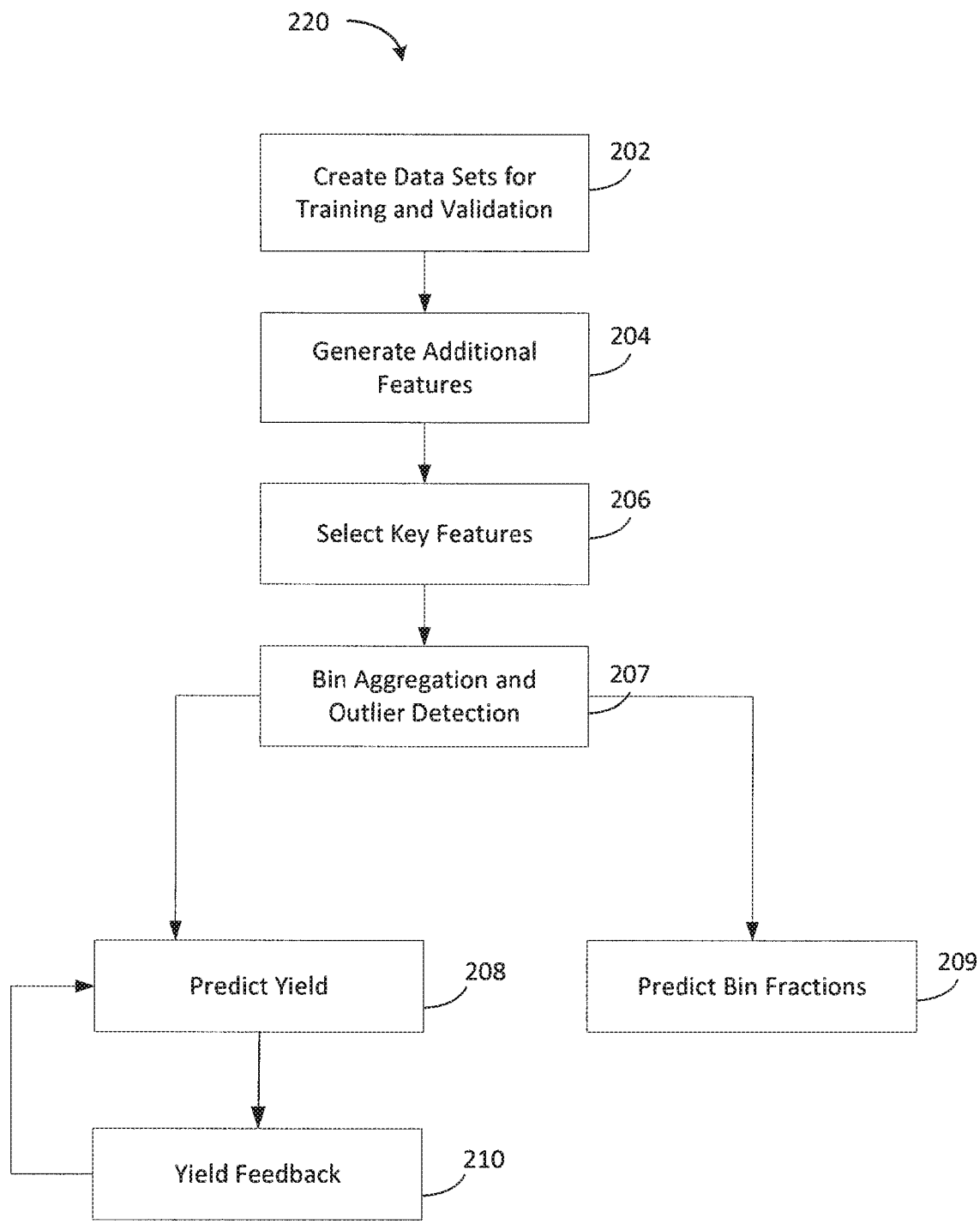
FIG. 2B is a flow chart illustrating an alternative method for making yield predictions.

FIG. 2B illustrates an alternative method 220 that includes predicting bin fractions. Steps 202, 204 and 206 are the same as in FIG. 2. In step 207, however, chip binning information is obtained and aggregated, and outliers are detected. Along one path, yield is predicted in step 208 as in FIG. 2. In step 210, however, feedback is generated and provided to the yield prediction module in step 208 as a means to adjust the yield calculation. Along a separate path, in step 209, bin fractions are predicted. These steps are described in more detail below.

Step 1: Creation of Training and Validation Dataset

Figure 3:
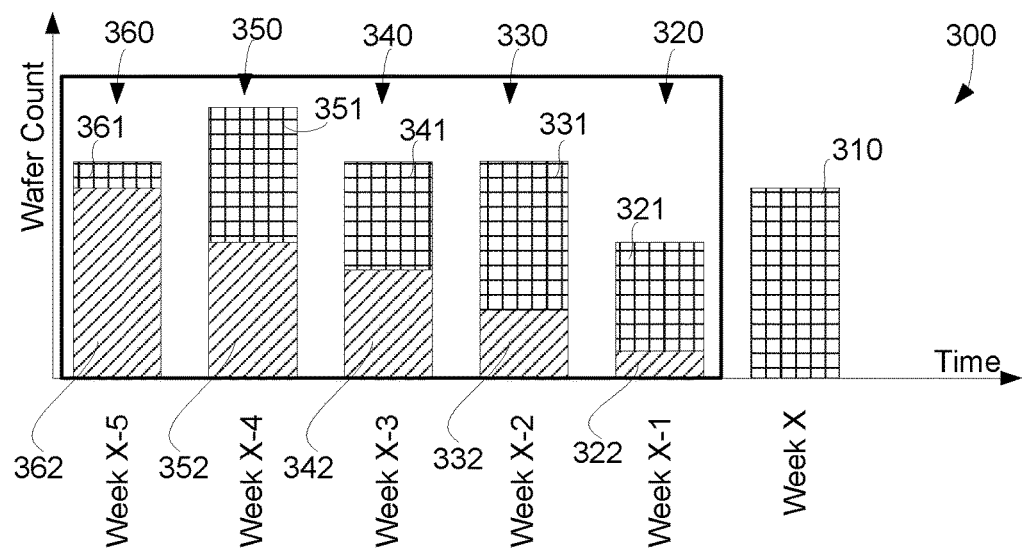
FIG. 3 is a graph illustrating the temporal dependency of test data by plotting wafer count over time.

One of the main issues associated with yield prediction is that there is a temporal dependency in the WAT data measurements. Thus, sensor measurements from process equipment may exhibit temporal shifts and drifts in data as a result of changes in the manufacturing recipe, equipment degradation and maintenance, and other seasonal effects. For example, the chart 300 depicted in FIG. 3 is a graph of wafer count over time. Each of the data blocks 310, 320, 330, 340, 350 and 360 represents two distinct data sets: WAT data only, and combined WAT data and CP data. The data is collected from selected test sites, with the data recorded in the week in which the selected wafer completes WAT data measurement (i.e., a WATweek). Thus, the current week's data in block 310 is from WAT data only since there is no CP data recorded in the same week that the WAT data measurement of the selected wafer is completed. Last week's data is represented at block 320, with a large portion 321 of WAT data only and a small portion 322 of the data coming from both WAT data and CP test data. Two weeks ago is represented by block 330, with WAT data portion 331 and a small portion 332 (but larger than portion 322) of both WAT data and CP data. Three weeks ago is represented by block 340, with roughly equal portions 341, 342 of new WAT data only and combined WAT and CP data, respectively. Four weeks ago is represented by block 350, with a roughly equal portions 351, 352 of new WAT only data and both WAT and CP data, respectively, although the volume of the wafer count is greater in block 350 than in block 340. Finally, five weeks ago is represented by block 360, with a small portion 361 of WAT only data and a large portion 362 of both WAT and CP data.

It is evident from the chart that, on average, there can be anywhere from a three to six week delay between WAT data measurements and CP test data. The time delay between the WAT data at the final stage and the CP data are impacted by wafer inventory, market demand, and product priorities. Further, wafer volume may differ drastically week to week. In addition, the time between WAT data and CP data is stochastic, such that one group of wafers that have completed WAT data measurement may finish CP testing later than a second group of wafers that have completed WAT after the first group. In other words, the CP test does not follow First In First Out (FIFO) queue order from the WAT data measurement. Thus, what was once a key predictor of yield from a prior period, e.g., one year ago or one month ago, may not be applicable for more recent wafers. In order to address this issue, at least two approaches may be used for creating the training data set and validation data set to produce robust predictions.

In a first approach to creating data sets for the training and validation of a machine learning algorithm, data from the most recent week(s) is used as the validation set. By selecting the most recent data as the validation set, the model will have high accuracy for the most recently produced wafers, while possibly sacrificing accuracy for older wafers.

Figure 4:
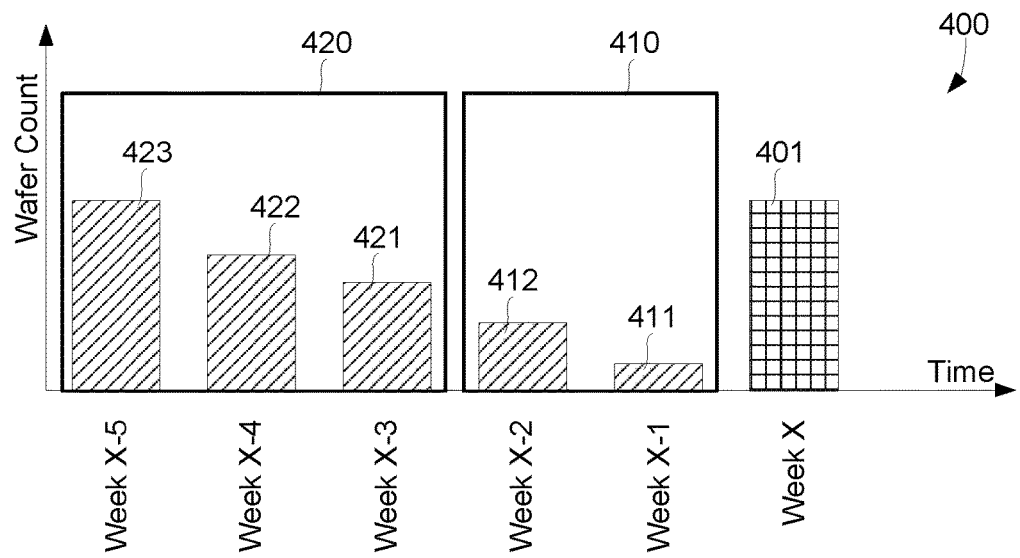
FIG. 4 is a graph illustrating wafer count over time for feature selection and/or model tuning.

For example, FIG. 4 is a chart 400 illustrating a training set 420 and a validation set 410 used for feature selection and/or model tuning. Chart 400 is similar to chart 300 of FIG. 3, except that only the combined WAT and CP data is relevant. Thus, block 401 is WAT only data from the current week, and this data is not used for yield calculation. Blocks 411, 412 represent combined WAT and CP data from the previous two weeks and form the validation set 410. Blocks 421, 422, 423 represent combined WAT and CP data from three to five weeks ago and form the training set 420.

Figure 5:
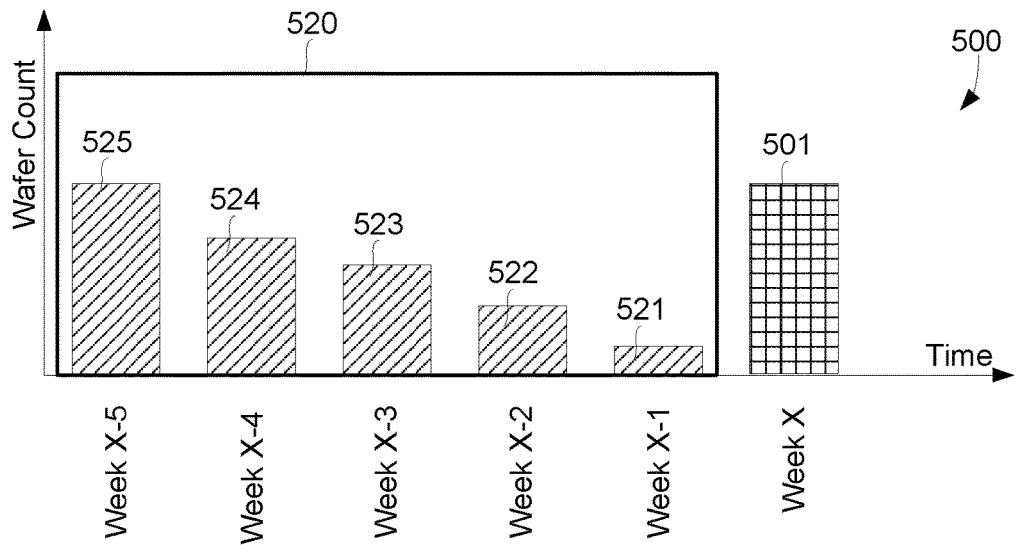
FIG. 5 is a graph illustrating wafer count over time for yield prediction.

FIG. 5 shows the training set 520 used for final prediction. Block 501 is the prediction set for WAT only data for the current week. Blocks 521, 522, 523, 524, 525 represent combined WAT and CP data from one to five weeks ago and form the training set 520.

Figure 6A:
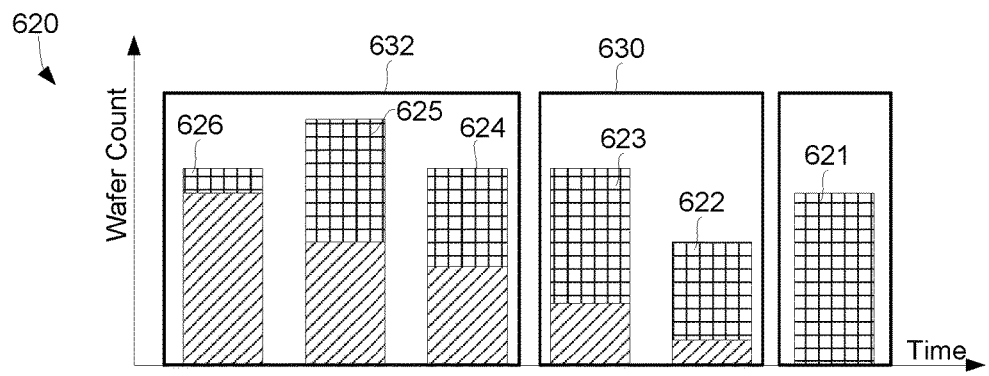
FIGS. 6A, 6B and 6C are comparative graphs of wafer count over time illustrating the use of multiple training sets having different sliding windows of data.
Figure 6B:
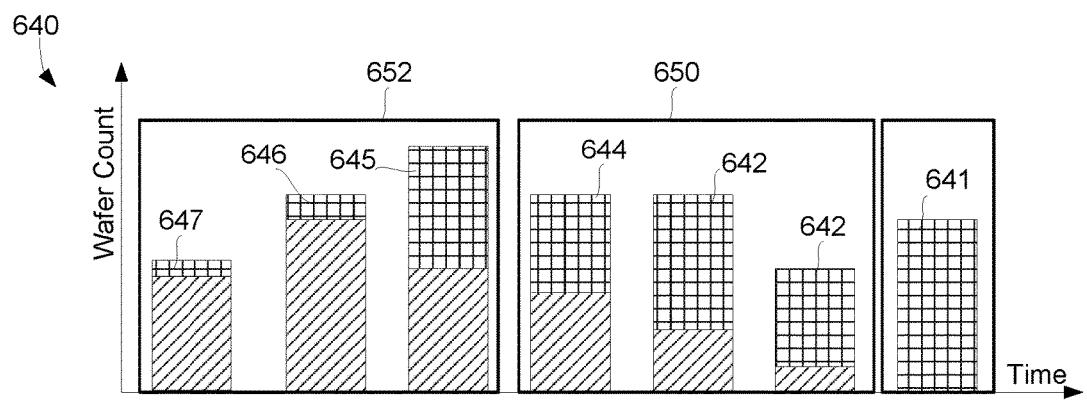
Figure 6C:
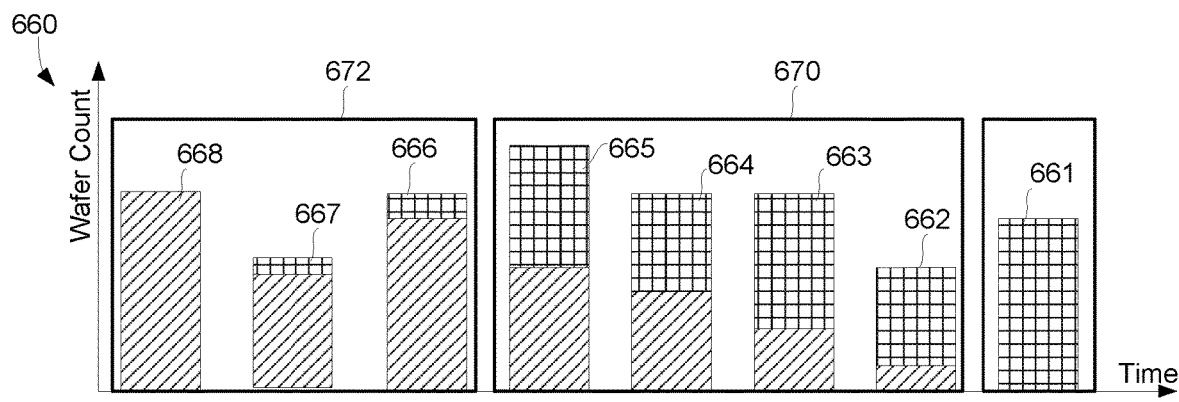

It is also possible to use different sliding windows for establishing the validation set. For example, FIGS. 6A, 6B and 6C illustrate three different models for creating the data sets. In a first model 620, block 621 represents the current prediction set, while the previous two weeks data (blocks 622, 623) form the validation set 630, and the three weeks prior to that (blocks 624, 625, 626) form the training set 632. In a second model 640, block 641 represents the current prediction set, while the previous three weeks data (blocks 642, 643, 644) form the validation set 650, and the three weeks prior to that (blocks 645, 646, 647) form the training set 652. In a third model 660, block 661 represents the current prediction set, while the previous four weeks data (blocks 662, 663, 664, 665) form the validation set 670, and the three weeks prior to that (blocks 666, 667, 668) form the training set 672.

In other words, if the current week is X, then the first model 620 is trained on data from week X-5 (five weeks ago) to week X-3 (three weeks ago), and validated using the last two weeks of data. The second model 640 is trained on data from week X-6 to week X-4, and validated using the last three weeks of data. The third model 660 is trained on data from week X-7 to week X-5, and validated using the last four weeks of data.

In a second approach to creating data sets for the training and validation of a machine learning algorithm, will be selecting wafers from a test set that have similar WAT data measurements as the training set. The difficulty associated with this approach is defining what should be considered similar WAT data measurements. Many measurements are coarse discrete values, and distribution of these measurements could be multimodal. Finally, many of these measurements are not correlated with the yield.

Thus, in order to create the most relevant training set, the data set from the first approach is used to determine the most critical features and/or measurements. The nearest neighbor to the test set can then be found from the training set using these selected features and/or measurements only, for example, by normalizing features using z-transformation, percentile transformation, etc. and using distance metrics such as Euclidean, Manhattan, or Chebyshev distances. Yield can thus be predicted using all of these different combinations, and the ensemble model (FIG. 6) can be used to determine proper weights for these predictions.

Step 2: Feature Generation

In addition to the results from original testing, e.g., WAT data measurements and CP test data, additional wafer features can be generated for use in later model generation. Examples of general approaches that can be used to generate additional features include: (i) statistical summaries, with or without spatial partitioning; (ii) principle components, from dimensionality reduction methods; and (iii) outlier detection methods.

Thus, it is possible to use the Wafer Map to generate an additional set of features consisting of statistical summaries, such as average, standard deviation, etc., that can be determined for different spatial regions of the wafers, such as inner, outer, north, south, etc. (including the original N testing sites, where N=9, 13, etc.). Further, additional features can be created by applying dimensionality reduction techniques, such as principle component analysis (PCA), Singular Value Decomposition (SVD), and Restricted Boltzmann Machine (RBM), on the test data and related statistical summaries. The principle components can then also be used as new input features, and this helps reduce correlation among variables. Finally, individual features can be generated by the outputs of outlier detection methods and results, such as Statistical outlier score, Isolation Forest and DBSCAN, and captured anomaly scores.

The addition of these "engineered" features/variables to the wafer data architecture enables a significant expansion of available data that can be used to model and evaluate ongoing performance in order to predict future performance of any selected feature, including the most basic of desired results, yield. For example, a modern process may identify a number of wafer sites for testing to obtain relevant WAT data and/or CP test data, e.g., 250. By incorporating additional engineered features using the methods described above, the number of features or variables can be greatly expanded, for example, to identify 2000 to 6000 features per wafer.

Step 3: Feature Selection

Obviously, the greatly expanded feature set means that there are likely too many variables such that the process could easily provide too much data as a training set. In order to reduce this overfit of the training set, a two-step feature selection is used.

A first routine performs "univariate feature selection." This can be done by running each individual variable (both raw data and the features generated as described in step 1) through one or more robust regression algorithms, such as robust linear regression (i.e., RANSAC, Huber Regression, etc.), random forest algorithm, extra tree algorithm, etc. This routine determines if the feature/variable has any predictive power for the targeted result. If the feature/variable is determined to have significant predictive power, e.g., above a user-defined threshold or minimum information threshold, then the feature/variable can be considered important and included in the yield prediction module.

A second routine performs "multivariate feature selection." This step removes any additional coupling of variables by feeding in features/variables that were identified as important into one or more multivariate regression algorithms, such as robust regression algorithms, robust linear regression (i.e. RANSAC, Huber Regression, etc.), random forest algorithm, extra tree algorithm, etc. This second routine thus further shortens the list of important features/variables. If the feature/variable has significant predictive power above a user-defined threshold, then it can be considered important and included in the yield prediction module.

Note that the first step could remove a coupled feature useful for predicting yield in the multivariate approach. However, the conservative approach is to reduce overfitting by leaning toward an underfitting model.

Step 4: Bin Aggregation and Outlier Detection

Information about how each chip is binned or categorized can be aggregated at the same frequency at which yield prediction is performed. This can provide additional information about the process in which the particular wafer or lot was created, which may or may not be contained within the WAT data or the PC test data. After aggregation, robust outlier detection methods as well as methods utilizing time series analyses can be applied to identify if there are any outliers or general shifts in the binning trends. This information could be used to exclude data during model training or be included as an additional input feature.

Step 5: Yield Prediction

One method of predicting yield is to run a number of different algorithms using the important features/variables identified in previous steps as inputs to the algorithms, with measured yield the modeled result, and to combine and evaluate the results.

In one example, the algorithms can be grouped into three main types: (i) a bagging-based algorithm that is designed to reduce variance, such as Random Forest, Extra Tree Model, etc.; (ii) an algorithm that is designed to reduce bias, such as the Gradient Boosting Machine, Alternating Model Tree; and (iii) a regression algorithm that is capable of extrapolating beyond the existing dataset, such as RANSAC linear regression and Huber Regression.

The yield prediction results from each the above three algorithms can be numerically combined in different ways, for example, averaged, a weighted combination of the outputs, or the best prediction per a validation set of the three types of algorithms.

These yield predictions must be further aggregated for different training sets whenever a multiple training set approach is used. In order to find the most appropriate weights, historical predictions are used to optimize the objective for each training set and combination of algorithms as an input. The objective function is customizable to meet desired goals. For example, it might be preferable to use mean square error, mean absolute error, or mean square error with an additional penalty function to penalize for missing desired specification.

Step 6: Bin Fractions Prediction

A time-series analysis of previous bin fractions, such as ARIMA and Markov Chain, can be used to predict current bin fractions, and the predicted yield from a previous step can be used as an input for the bin prediction. Automatic determination is used to ascertain whether the predicted yield is necessary for reliable bin prediction, and the determination can include absolute cutoffs and statistical significance.

Step 7: Feedback into Yield Prediction

If there is a strong correlation (i.e., statistically significant) between the yield errors (actual yield-predicted yield) with bin predictions or bin outliers, then this information can be used to feedback into the yield prediction module to reduce errors and improve accuracy.

Step 8: Variable Importance

The importance of a particular variable is determined by calculating the relative influence of each variable, i.e., was the variable selected during splitting in the tree building process, and how much did the squared error (over all trees) improve as a result.

For example, the following steps identify variable importance: (1) remove the engineered features from the wafer map; and (2) use a single model rather than blend of multiple models. This single model can be generated from any tree-based algorithm that uses all of the raw inputs, or a set of data that contains both raw inputs and transformed inputs.

5. Conclusion

The foregoing written description is intended to enable one of ordinary skill to make and use the techniques described herein, but those of ordinary skill will understand that the description is not limiting and will also appreciate the existence of variations, combinations, and equivalents of the specific embodiments, methods, and examples described herein.

The invention claimed is:

1. A method, comprising:
obtaining a plurality of wafer acceptance test data and a plurality of circuit probe test data from a semiconductor fabrication process, wherein a wafer being fabricated has a plurality of primary features disposed on the wafer and a wafer map identifying a location on the wafer for each of the plurality of primary features;
creating at least one training set of data and a least one validation set of data from the wafer acceptance test data and the circuit probe test data;
generating a plurality of engineered features and incorporating the engineered features onto the wafer map;
selecting a plurality of important features from the plurality of primary features and engineered features, the important features determined to have a measurable impact on yield; and
predicting yield by running a plurality of different process models having yield as a target and using the plurality of important features as inputs to the models.

2. The method of claim 1, the process models including a first model designed to reduce variance in the inputs and a second model designed to reduce bias in the inputs.

3. The method of claim 2, the process models including a third model designed to extrapolate additional data beyond the training set data and the validation set data.

4. The method of claim 1, further comprising a plurality of separate blocks of wafer acceptance test data and circuit probe test data, each block is recorded for a week in which a wafer acceptance test is completed.

5. The method of claim 4, wherein the validation set of data is selected from one or more recent weeks of the wafer acceptance test data and circuit probe test data.

6. The method of claim 5, further comprising a plurality of training sets of data and a plurality of validation sets of data, wherein each of the plurality of training sets of data is coupled with a different one of the plurality of validation sets of data, each different one of the plurality of validation sets of data encompassing a different number of weeks of the wafer acceptance test data and circuit probe test data.

7. The method of claim 1, wherein the training set of data is obtained from one or more other wafers that have similar wafer acceptance test data.

8. The method of claim 1, wherein the engineered features are generated from statistical summaries of the wafer acceptance test data and the circuit probe test data.

9. The method of claim 1, wherein the engineered features are generated from a principal component analysis of a dimensionality reduction method.

10. The method of claim 1, wherein the engineered features are generated from outlier detection methods.

11. The method of claim 1, wherein the important features are selected using univariate feature selection.

12. The method of claim 1, wherein the important features are selected using multivariate feature selection.

13. The method of claim 1, further comprising aggregating bin information for a plurality of chips on the wafer.

14. The method of claim 13, further comprising identifying bin outliers from the aggregated bin information.

15. The method of claim 14, further comprising predicting bin fractions.

16. The method of claim 15, further comprising:
providing feedback to the yield prediction step when yield errors have a strong correlation with either bin fraction predictions or bin outliers.

17. A method, comprising:
obtaining a plurality of wafer acceptance test data and a plurality of circuit probe test data from a semiconductor fabrication process, wherein a wafer being fabricated has a plurality of primary features disposed on the wafer and a wafer map identifying a location on the wafer for each of the plurality of primary features;
creating at least one training set of data and a least one validation set of data from the wafer acceptance test data and the circuit probe test data;
generating a plurality of engineered features and incorporating the engineered features onto the wafer map;
evaluating an impact on yield for each of the plurality of primary features and the plurality of engineered features;
selecting a plurality of important features from the plurality of primary features and engineered features, the important features determined in the evaluating step to have an impact on yield above a first user-defined threshold; and
predicting yield by running a plurality of different process models having yield as a target and using the plurality of important features as inputs to the models.

18. The method of claim 17, the evaluating step further comprising:
performing univariate feature selection by running each feature of the plurality of primary features and the plurality of engineered features through at least one univariate regression routine to determine whether the feature has predictive power for yield by exceeding a second user-defined threshold, each feature that exceeds the second user-defined threshold is an included feature; and performing multivariate feature selection by running each included feature through a multivariate regression routine to determine whether the included feature has predictive power for yield by exceeding a third user-defined threshold, each included feature that exceeds the second user-defined threshold is one of the important features and used as input to the models.

* * * * *